(12) United States Patent
Kawase et al.

(10) Patent No.: US 6,188,299 B1
(45) Date of Patent: Feb. 13, 2001

(54) DIELECTRIC FILTER AND METHOD OF MANUFACTURING THE SAME

(75) Inventors: Hirotsugu Kawase; Hikaru Achiha, both of Ise (JP)

(73) Assignee: NGK Spark Plug Co., Ltd. (JP)

( * ) Notice: Under 35 U.S.C. 154(b), the term of this patent shall be extended for 0 days.

(21) Appl. No.: 09/264,892

(22) Filed: Mar. 9, 1999

(30) Foreign Application Priority Data

Mar. 24, 1998 (JP) .................................................. 10-096789

(51) Int. Cl.[7] .............................. H01P 1/202; H01P 1/213; H01P 11/00
(52) U.S. Cl. .............................. 333/206; 333/134; 29/840; 29/851
(58) Field of Search .................................. 333/134, 206, 333/207, 222, 202; 29/840, 851

(56) References Cited

U.S. PATENT DOCUMENTS

| 5,250,916 | 10/1993 | Zakman | 333/206 |
| 5,517,162 | 5/1996 | Ariyoshi | 333/222 |
| 5,636,104 | * 6/1997 | Oh | 361/777 |
| 5,695,109 | * 12/1997 | Chiang et al. | 228/33 |

FOREIGN PATENT DOCUMENTS

| 0 577 347 | 1/1994 | (EP) . |
| 6-204708 | * 7/1994 | (JP) . |
| 11-88013 | * 3/1999 | (JP) . |

OTHER PUBLICATIONS

JP Patent Kokai No. S630311801, Inventor Yamashita, Y.: abstract only, Dec. 20, 1988.
Patent Abstracts of Japan, vol. 95, No. 10, Nov. 30, 1995—& JP 07 176913 A (Marata Mfg Co Ltd), Jul. 14, 1995 * abstract; figures 1–4.
Patent Abstracts of Japan, vol. 95, No. 9, Oct. 31, 1995 & JP 07 147505 A (Marata Mfg Co Ltd), Jun. 6, 1995 * abstract*.
Patent Abstracts of Japan, vol. 18, No. 416 (E–1588), Aug. 4, 1994 & JP 06 125206 A (TDK Corp), May 6, 1994 * abstract *.

* cited by examiner

Primary Examiner—Robert Pascal
Assistant Examiner—Barbara Summons
(74) Attorney, Agent, or Firm—Larson & Taylor, PLC (57) ABSTRACT

A dielectric filter device comprising a resonator body formed by arranging a plurality of resonators in parallel in a same direction and a laminated circuit arrangement to be bonded to an open-circuit end surface of the resonator body, wherein a bonding means is provided to mechanically bond them with a sufficient strength and establish required electric connections between them, said bonding means includes solder balls (20) for electrically connecting the resonator body (1a) and the laminated circuit arrangement (10a) bonded to the open-circuit end surface of the resonator body (1a) to produce solder sections p having a uniformly dotted profile. Unlike conventional techniques using an electrically conductive adhesive agent, such solder sections p provide a sufficient bonding strength without requiring any cumbersome operation.

4 Claims, 9 Drawing Sheets

DIELECTRIC FILTER AND METHOD OF MANUFACTURING THE SAME

BACKGROUND OF THE INVENTION

The present invention relates to an integral type dielectric filter device having two unit filters of different types with different pass frequency bands such as a duplexer that is suitably be used for a portable telephone set. It also relates to a method of manufacturing such a dielectric filter device.

PRIOR ART

Japanese Patent Kokai No. 63-311801 discloses a dielectric filter device comprising a plurality of resonators arranged in parallel in a direction on a dielectric ceramic block which has outer peripheral surface coated with an grounding conductor except an open-circuit end surface where through holes of the resonators are exposed. The dielectric filter device is mounted on a printed circuit substrate or board provided with a coupling circuit which is coupled to the related resonators. The dielectric filter and the substrate are housed in a metal casing. Various similar dielectric filter devices have also been proposed to date.

In such a dielectric filter device, each of the resonators is provided with a metal terminal driven into it in order to capacitively couple the resonators and the metal terminals are connected to a capacitor circuit formed on the printed circuit substrate so that, as a whole, the dielectric filter device requires a cumbersome operation of connecting wires and involves a considerable number of assembling steps reflecting a complicated circuit design and a clumsy circuit arrangement.

In an attempt to avoid the above problem, the inventors of the present patent application proposed a dielectric filter device comprising a resonator body in which a plurality of resonators are arranged in parallel in a same direction and each of the resonators includes a through hole whose inner surface is coated with an inner conductor, and a laminated circuit arrangement having connection terminals which is realized by laminating a plurality of dielectric sheet materials and arranged on the open-circuit end surface of the resonator body, each of the resonators being electrically connected to the corresponding connection terminals of the resonator body on the bonded surface (Japanese Patent Kokai No. 9-257766).

With the arrangement wherein a laminated circuit arrangement is bonded to the open-circuit end surface of the resonator body, the respective terminals also have to be electrically connected with each other. While the use of an electrically conductive adhesive agent may be conceivable, such an agent normally does not provide a sufficient bonding effect and the electric connections are apt to become disrupted by mechanical impact.

It is, therefore, an object of the present invention is to provide a dielectric filter device that is capable of overcoming these problems.

Another object of the present invention is to provide a method of manufacturing such a dielectric filter device.

SUMMARY OF THE INVENTION

According to one aspect of the invention, there is provided a dielectric filter device comprising a resonator body in which a plurality of resonators are provided in parallel in a same direction, each having a through hole whose inner surface is coated with an inner conductor, and a laminated circuit arrangement including a plurality of dielectric sheet materials which are laminated one after another and bonded to an open-circuit end surface of the resonator body, each of the resonators being electrically connected with a corresponding one of connection terminals of the resonator body, on the open-circuit end surface, wherein the filter device comprises solder members arranged between the resonator body and the laminated circuit arrangement for bonding the laminated circuit arrangement and the resonator body and electrically connecting the connection terminals of the laminated circuit arrangement with the respective resonators of the resonator body.

Preferably, the solder members may be provided by arranging solder balls between the resonator body and the laminated circuit arrangement in such a manner that each solder ball is positioned between an open-circuit end of each of the through holes of the resonators of the resonator body and a corresponding one of the connection terminals of the laminated circuit arrangement and melting/solidifying the solder balls.

With the above arrangement, as the solder balls are molten and subsequently solidified, they tend to make a uniformly dotted solder section due to the surface tension of the molten solder, which provides a reliable mechanical bond and also a reliable electric connection for the resonator body and the laminated circuit arrangement. Additionally, the entire bonding process can be easily controlled because it simply consists in arranging solid solder balls at appropriate positions before melting and solidifying them.

When such a dielectric filter device is to be realized as an integral type dielectric filter device having two unit filters of different types, the resonators of the resonator body are divided into two groups, a first filter section and a second filter section. A dielectric duplexer device can be obtained by using the first and second filter sections respectively as a receiver section and a transmitter section.

According to another aspect of the invention, there is provided a method of manufacturing a dielectric filter device comprising the steps of:

preparing a resonator body by arranging a plurality of resonators in parallel in a same direction, each having a through hole whose inner surface is coated with an inner conductor layer;

preparing a laminated circuit arrangement by stacking a plurality of dielectric sheet members each having a desired circuit pattern and sintering them, the laminated circuit arrangement being provided with a plurality of connection terminals on one of outer surfaces which is to be bonded to an open-circuit end surface of the resonator body; and bonding the resonator body and the laminated circuit arrangement together and electrically connecting the resonators and the corresponding connection terminals by arranging a solder ball between a open-circuit end of each of the resonators of the resonator body and the corresponding connection terminals of the laminated circuit arrangement and melting/solidifying the respective solder balls.

When bonding the dielectric filter body and the laminated circuit arrangement to each other, preferably, solder balls are supported by the open-circuit ends or edges of the through holes of the resonator body and the resonator body is placed in a holding hole of a jig with the laminated circuit arrangement arranged on the it to melt and solidify the solder balls by heating and cooling respectively in order to bond and electrically connect the resonator body and the laminated circuit arrangement.

Then, since the open-circuit ends or edges of the through holes are used for positioning the solder balls, the bonding and the electric connection of the resonator body and the laminated circuit arrangement can be realized simply by electrically connecting the respective open-circuit ends or edges of the through holes and the corresponding connection terminals on the laminated circuit arrangement without any additional operation.

Alternatively, solder balls may be arranged on the connection terminals of the laminated circuit arrangement and the resonator body is placed in a holding hole of a jig with its the open-circuit end surface directed downward to melt and solidify the solder balls by heating and cooling respectively in order to bond and electrically connect the resonator body and the laminated circuit arrangement.

The length of a resonator should be defined as a function of the wavelength corresponding to the frequency to be used with it. Therefore, in case the present invention is to be applied to a dielectric duplexer device, the first filter section and the second filter section arranged in the resonator body may have to show different lengths to consequently give rise to a step at the end opposite to the end to which the laminated circuit arrangement is bonded. With such a resonator body, the laminated circuit arrangement is placed low in a holding hole of a jig and solder balls are arranged on the connection terminals of the laminated circuit arrangement with the resonator body arranged thereon before the solder balls are molten and solidified to bond and electrically connect the resonator body and the laminated circuit arrangement.

In such a case, preferably, holding grooves may be provided in the laminated circuit arrangement at positions corresponding to the terminal connections for holding respective solder balls. Then, the solder balls can be supported stably. It should be appreciated that such holding grooves may be formed also when the laminated circuit arrangement is arranged on the resonator body.

DESCRIPTION OF THE PREFERRED EMBODIMENT

Figure 14:
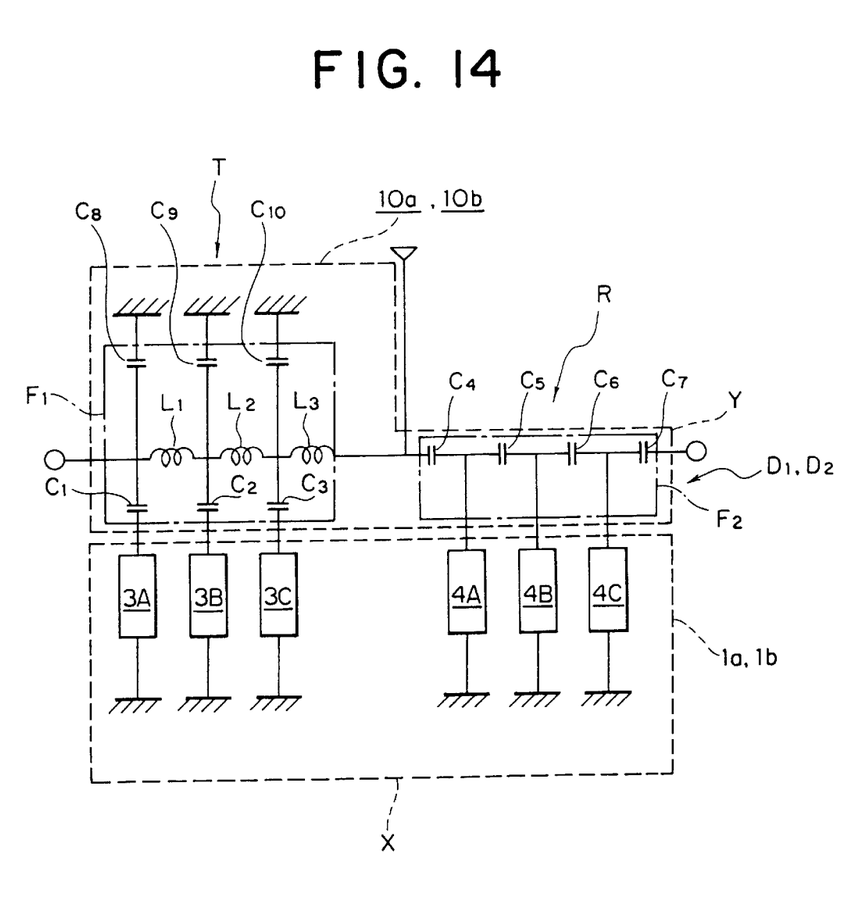
FIG. 14 is a schematic circuit diagram of an equivalent circuit for the embodiments of FIGS. 1 and 8.

Now, the present invention will be described by referring to the accompanying drawings that illustrate preferred embodiments of dielectric filter device according to the present invention, which are dielectric duplexer devices D1 and D2. Note that the circuit diagram of the transmitter and the receiver of FIG. 14 is applicable to the both embodiments.

Figure 1:
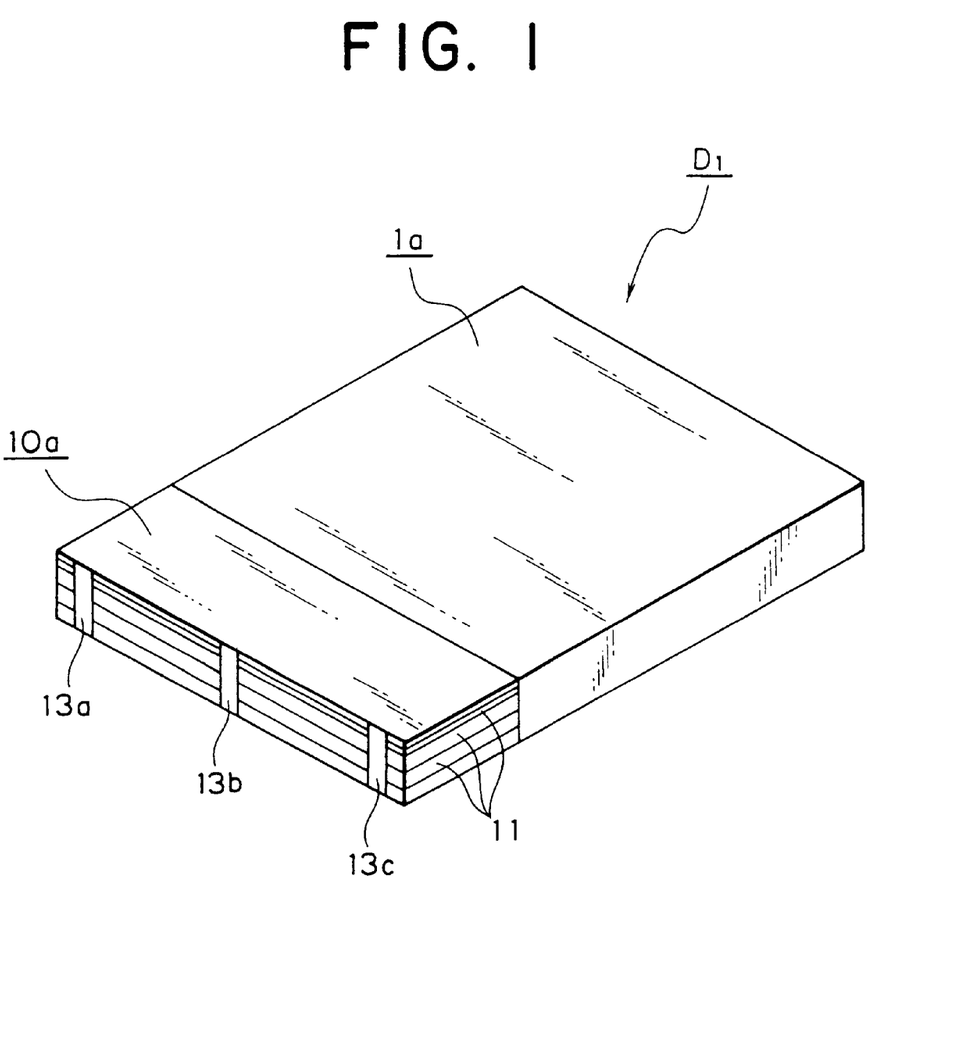
FIG. 1 is a schematic perspective view showing an embodiment of the invention, which is a dielectric duplexer device.
Figure 2:
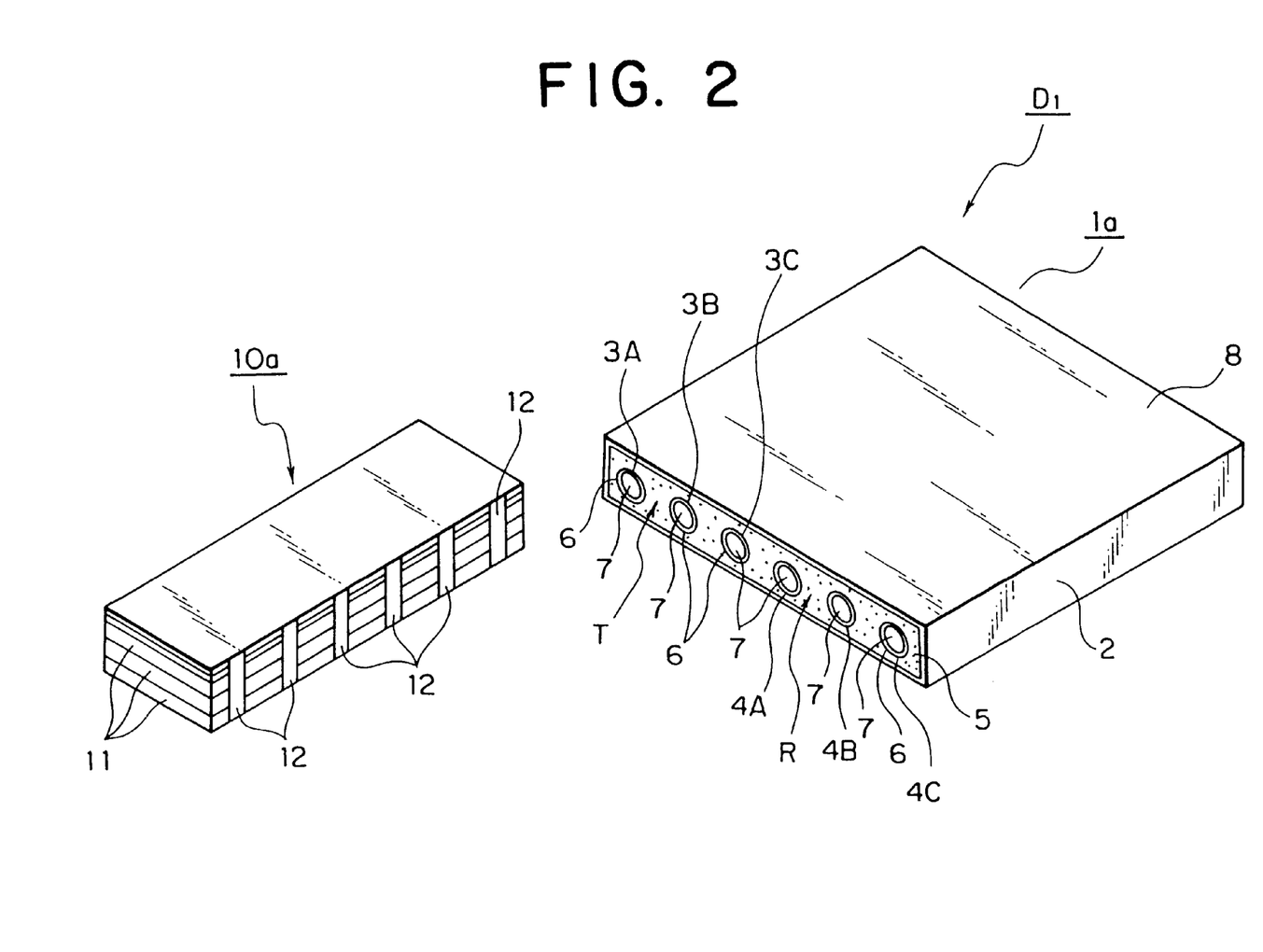
FIG. 2 is an exploded schematic perspective view of the dielectric duplexer device of FIG. 1.

FIGS. 1 and 2 show a first embodiment of the invention, which is a dielectric duplexer device D1. The dielectric duplexer device D1 comprises a resonator body 1a made of a single dielectric ceramic block 2 and including a total of six resonators 3A, 3B, 3C and 4A, 4B, 4C arranged in parallel in a same direction on the dielectric ceramic block 2, and a laminated circuit arrangement 10a bonded to the resonator body 1a to cover the entire open-circuit end surface 5 of the resonator body 1a. For example, the height, the width and the length of the illustrated dielectric duplexer device may be designed to have dimensions of a height of 2.5 mm, a width of 15 mm and a length of 14 mm.

Figure 5:
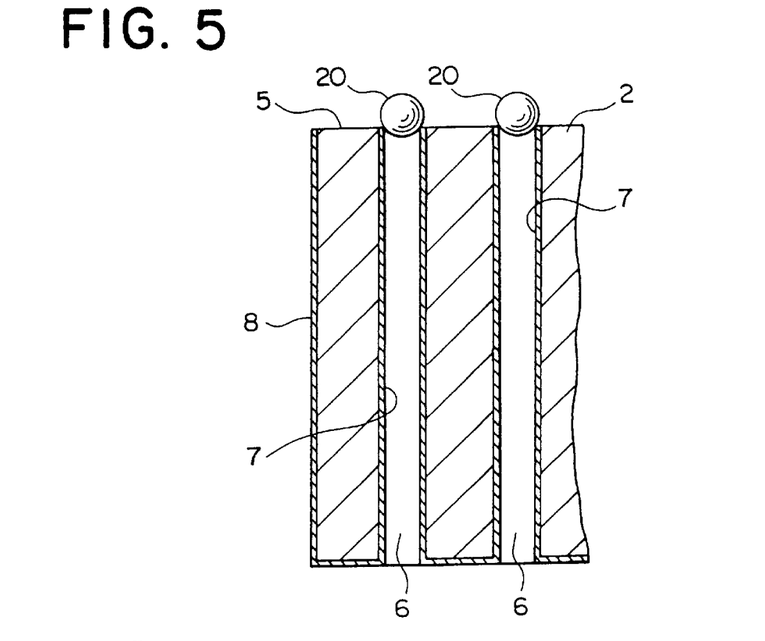
FIG. 5 is a schematic cross sectional partial side view showing a resonator body carrying thereon solder balls.

The resonator body 1a is formed by the single dielectric ceramic block 2 prepared by sintering a dielectric ceramic material, which may be of a titanium oxide type or of a barium oxide type. Each of the resonators 3A through 3C for transmission and the resonators 4A through 4C for reception comprises a through hole 6 provided to be extended from one end surface to the other end surface of the dielectric ceramic block 2 and an inner conductor layer 7 which is provided on the inner peripheral surface of the respective through hole 6 as shown in FIG. 5. The outer surfaces of the dielectric ceramic block 2 are substantially coated with an outer conductor layer 8 except the open-circuit end surface 5 of the dielectric ceramic block 2. This outer conductor layer 8 is grounded.

The resonators 3A through 3C and 4A through 4C are made to show a length substantially equal to the resonance length corresponding to a quarter of the frequency $\lambda$ or $\lambda/4$ with which the dielectric filter device is used. The resonators 3A through 3C and 4A through 4C form a resonator circuit X as shown in FIG. 14.

The laminated circuit arrangement 10a is formed by sequentially laying a plurality of rectangular dielectric sheet members 11 one on the other and integrally sintering them. Each of the dielectric sheet members 11 is typically made of glass ceramic, a composite material of glass and dielectric ceramic material or a low melting point oxide. The laminated circuit arrangement 10a thus prepared has a rear layered side portion which shows a rectangular contour dimensioned to rightly cover the entire open-circuit end surface 5 of the resonator body 1a.

Each of the dielectric sheet members 11 of the laminated circuit arrangement 10a carries on the upper surface and along the peripheral edges thereof printed and patterned conductors that are appropriately connected so as to form a coupling circuit Y as shown in FIG. 14 when the dielectric sheet members 11 are laid one on the other. The coupling circuit Y comprises a low pass filter circuit section F1 including capacitors C1, C2, C3, C8, C9 and C10 and inductors L1, L2 and L3, and a band pass filter circuit section F2 formed by the resonators 4A through 4C of the receiver section R and capacitors C4, C5, C6 and C7. The rear layered side portion of the laminated circuit arrangement 10a is provided with a plurality of connection terminals 12 which are connected with the respective the inner conductor layers 7 of the resonators 3A through 3C and 4A through 4C. A front layered side portion of the laminated circuit arrangement 10a is provided with a plurality of connection pads 13a, 13b and 13c and other components for connecting the circuit of the laminated circuit arrangement 10a to the circuit on a printed circuit board or substrate not shown.

Thus, since the laminated circuit arrangement 10a is formed as a single chip by integrally sintering the dielectric sheet members 11, a simple and thin cubic-shaped dielectric duplexer device is produced in a simple manner by bonding it to the open-circuit end surface 5 of the resonator body 1a.

More specifically, as the rear layered side portion of the laminated circuit arrangement 10a that comprises a plurality of dielectric sheet members 11 is bonded to the open-circuit end surface 5 of the dielectric ceramic block 2, the low pass filter section F1 is coupled to the resonators 3A through 3C for the transmitter section T, while the band pass filter section F2 is coupled to the resonators 4A through 4C for the receiver section R. In this way, there is provided a dielectric duplexer device that comprises a coupling circuit Y and a resonator circuit X as shown in FIG. 14.

It will now be described how the bonding and coupling between the open-circuit end surface of the resonator body 1a and the laminated circuit arrangement 10a may be carried out, which is an essential matter of the present invention.

The resonator body 1a and the laminated circuit arrangement 10a are mechanically bonded together and the resonators 3A through 3C and 4A through 4C of the resonator body 1a and the connection terminals 12 of the laminated circuit arrangement 10a are electrically connected with each other by means of solder balls 20.

The solder balls are typically made of a silver/tin or lead/tin alloy and have a spherical profile. Alternatively, small spherical pieces of metal such as silver or copper coated with solder may be used. It should be, therefore, appreciated that the wording "solder ball" includes the concept of such a spherical piece of metal such as silver or copper coated with solder. The solder balls 20 have a diameter between about 0.1 mm and about 3.0 mm, which is slightly greater than the bore of the through holes 6. For example, if the respective through holes 6 have a bore of 0.8 mm, the respective solder balls 20 may be made to show a diameter of about 1.5 mm.

Figure 3:
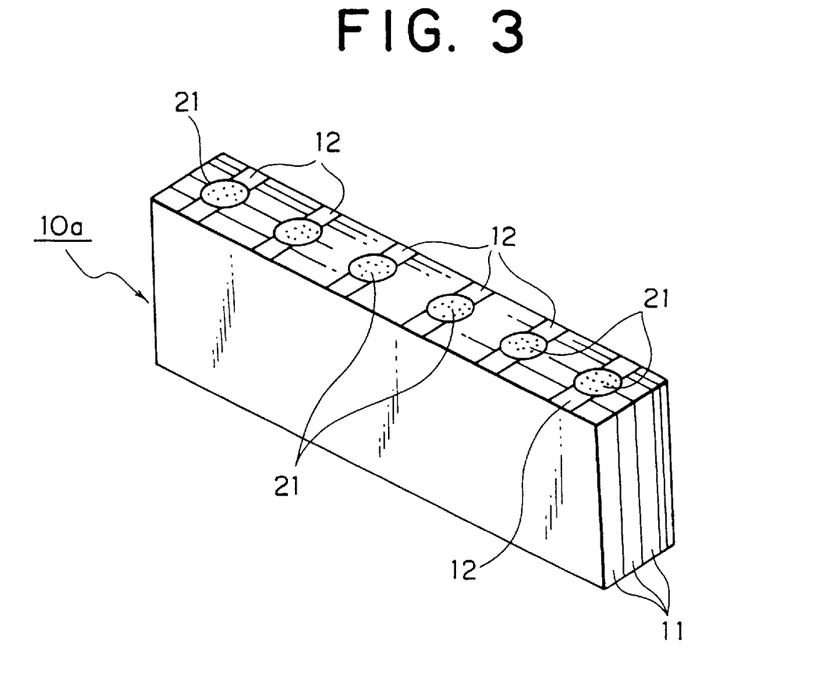
FIG. 3 is an enlarged schematic perspective view showing a laminated circuit arrangement in the embodiment of FIG. 1.
Figure 4:
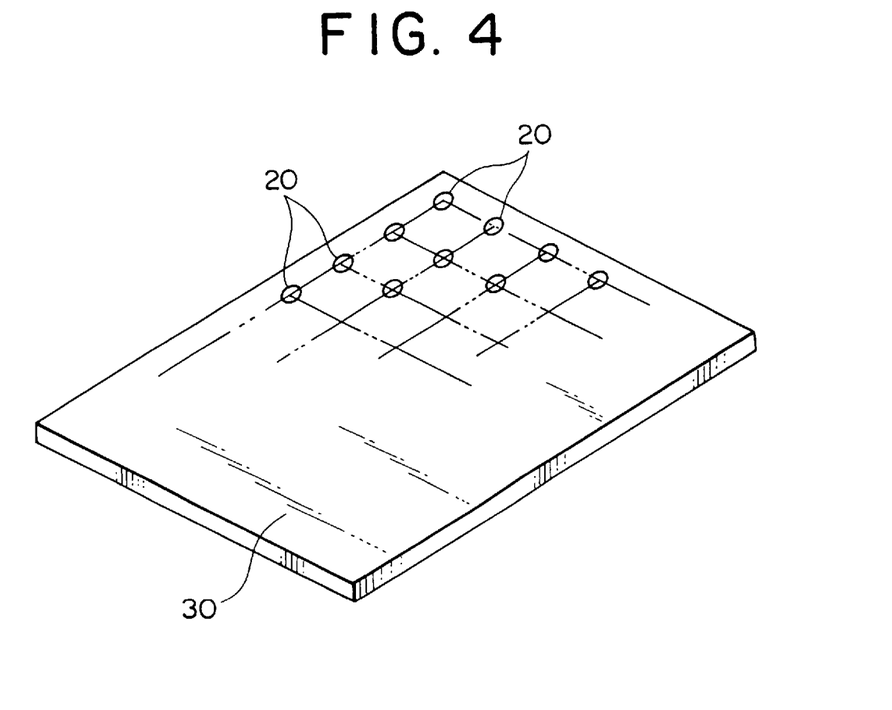
FIG. 4 is a schematic perspective view showing a solder ball aligner plate which is used when the dielectric duplexer device according to the embodiment of FIG. 1 is manufactured.

As shown in FIG. 3, solder paste 21 is applied to a central portion of each of the connection terminals 12 of the laminated circuit arrangement 10a by means of printing. On the other hand, as shown in FIG. 4, the solder balls 20 are arranged in array at positions corresponding to the respective through holes 6 by means of an aligner plate 30. Then, the solder balls 20 arranged in array are transferred onto the respective through holes 6 typically by a vacuum suction means or some other transfer means, maintaining the array, as shown in FIG. 5. As a result, the solder balls 20 are received at lower portions thereof in the respective through holes 6 and stably held there.

Figure 6:
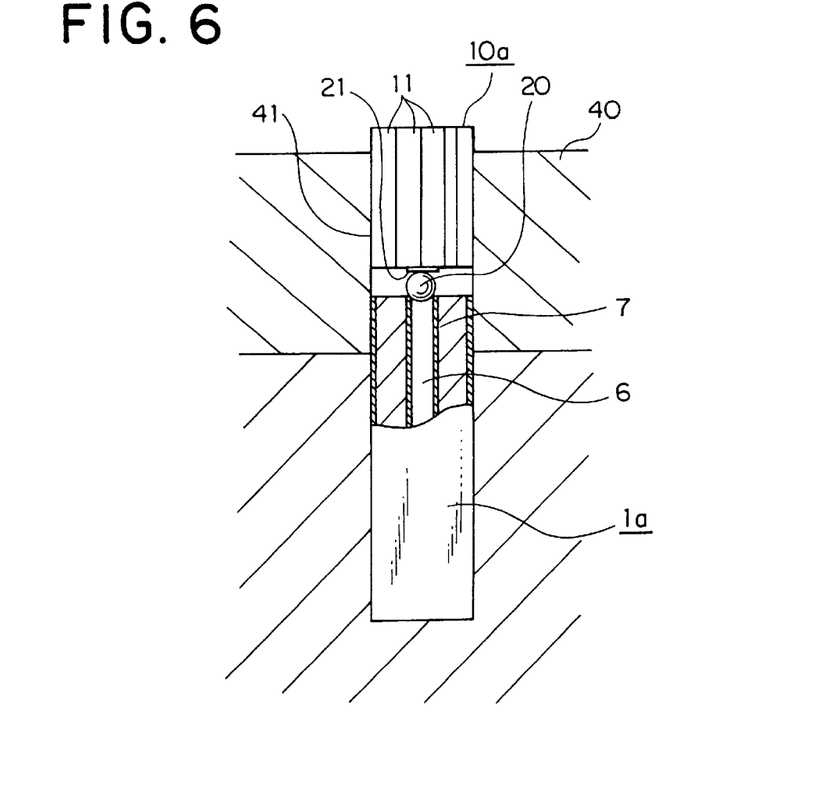
FIG. 6 is a schematic cross sectional side view showing the dielectric duplexer device of FIG. 1 placed in a jig during the assembly thereof.
Figure 7:
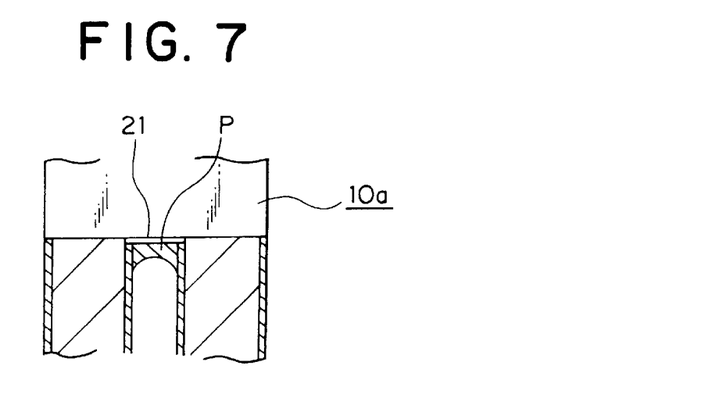
FIG. 7 is an enlarged schematic partial view of the embodiment of FIG. 1, showing how the resonator body and the laminated circuit arrangement are bonded together.

Then, as shown in FIG. 6, the laminated circuit arrangement 10a is placed on the resonator body 1a on the layered side surface of the laminated circuit arrangement 10a to be bonded facing downward with the solder balls interposed therebetween and put into the holding hole 41 of a jig 40, while maintaining the assembled state. Then, the inside of the holding hole 41 is heated to temperature higher than the melting point of the solder balls, which is typically about 238° C. in case the respective solder balls have a composition of $Sn_{63}Pb_{37}$. As a result, the solder balls 20 become molten and then solidified automatically to produce solder sections P as shown in FIG. 7. While the solder balls 20 have a melting point of about 238° C., they will become molten at about 220° C. when the inside of the holding hole 41 is evacuated before it is heated.

Since the solder balls 20 are supported by the edges of the respective through holes 6, they enter the respective through holes 6 without spreading out to the outside of the through holes 6 during the molten condition. Additionally, when molten, each solder ball is pulled to the center thereof by the surface tension of the molten solder so that they are automatically aligned with the centers of the respective through holes 6. Thus, a concaved solder section P is formed in alignment with each of the edges of the resonators 3A through 3C and 4A through 4C and the corresponding connection terminal 12 to establish a reliable electric connection and also a reliable mechanical bond between them.

Figure 8:
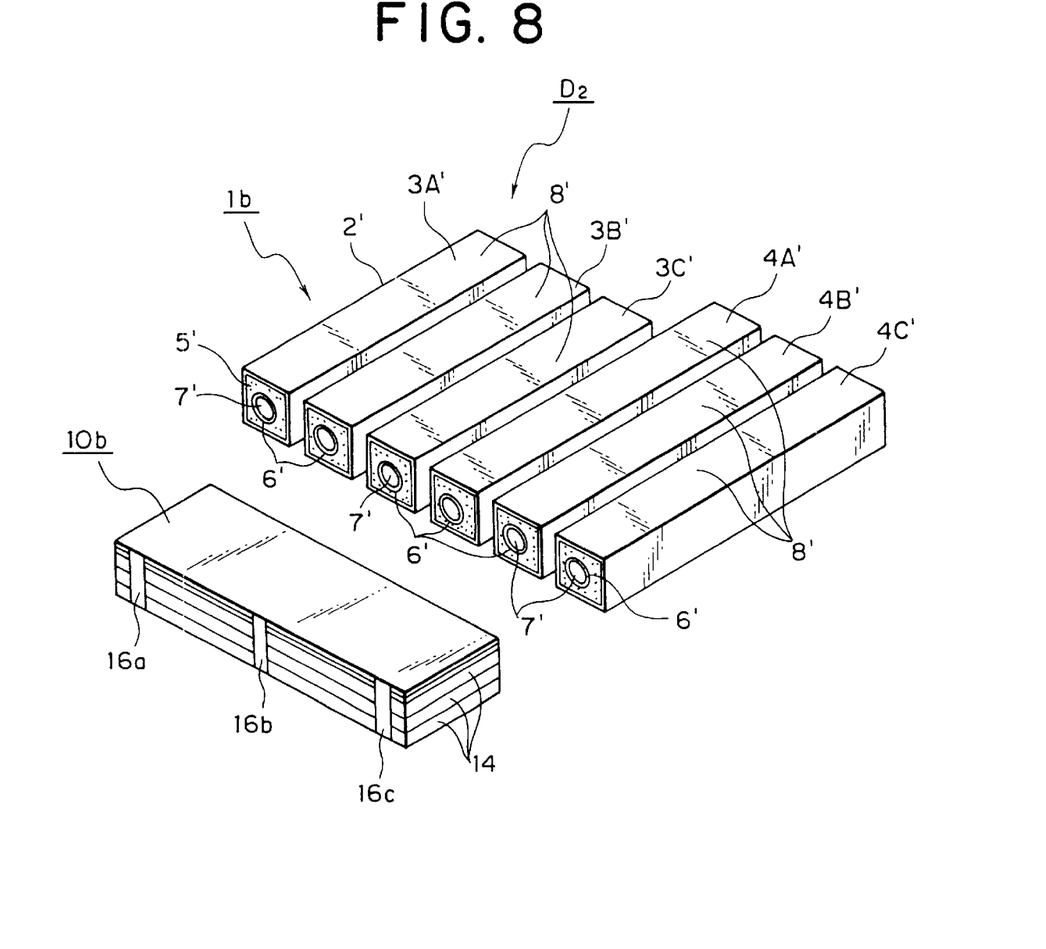
FIG. 8 is an exploded schematic perspective view showing another embodiment of the invention, which is also a dielectric duplexer device.

FIG. 8 illustrates another embodiment of the present invention, which is also a dielectric duplexer device D2.

The illustrated dielectric duplexer device D2 comprises a resonator body 1b including a total of six coaxial type resonators 3A', 3B', 3C' and 4A', 4B', 4C', and a laminated circuit arrangement 10b which is bonded to an open-circuit end surface 5' of the resonator body 1b. The coaxial type resonators are divided into two groups to provide a 3-pole type transmitter section T including the three resonators 3A' through 3C' and a 3-pole type receiver section R including the three resonators 4A' through 4C', and are arranged side by side and bonded together.

Each of the resonators 3A' through 3C' and 4A' through 4C' comprises a dielectric ceramic block 2' prepared by sintering a dielectric ceramic material typically containing titanium oxide or barium oxide. Each resonator includes a through hole 6' provided through the dielectric ceramic block 2' and an inner conductor layer 7' applied to the inner surface or inner peripheral wall of the through hole 6'. The exposed outer surfaces of each dielectric block 2' are substantially coated with a grounding conductor 8' except the open-circuit end surface 5' of the dielectric block 2' where one of the openings of the respective through hole 6' is exposed.

The laminated circuit arrangement 10b may be formed in the same manner as the embodiment illustrated in FIGS. 1–7. That is, the laminated circuit arrangement 10b comprises a plurality of rectangular dielectric sheet members 14 which are stacked one on the other and then integrally sintered. Each of the dielectric sheet members 14 is typically made of glass ceramic, a composite material of glass and dielectric ceramic material or a low melting point oxide. The rear layered side portion of the laminated circuit arrangement 10b thus prepared shows a rectangular contour dimensioned to rightly cover the entire open-circuit end surface 5' of the resonator body 1b.

Each of the dielectric sheet members 14 of the laminated circuit arrangement 10b has an upper surface and the peripheral edges provided with conductors printed and patterned that are appropriately connected so as to form the coupling circuit Y as shown in FIG. 14. The laminated circuit arrangement 10b has a rear layered side portion provided with a plurality of grooves 15 for holding the respective solder ball 20 and a front layered side portion provided with a plurality of connection pads 16a, 16b and 16c for connecting the circuit of the laminated circuit arrangement 10b to the circuit on a printed circuit board not shown. Each of the holding grooves 15 is provided at its bottom with a connection terminal 17 which is connected with the corresponding one of the respective the inner conductor layers 7' of the resonators 3A' through 3C' and 4A' through 4C'. Therefore, the laminated circuit arrangement 10b can be formed as a single chip, and thus a simple and thin cubic-shaped dielectric duplexer device can be provided.

A dielectric duplexer device D2 having such a configuration is advantageous in that the operating characteristics of the coaxial type resonators 3A' through 3C' and 4A' through 4C' can be regulated individually to optimize the performance of the resonator body 1b. The arrangement of the dielectric duplexer device D2 is particularly advantageous when the transmission frequency and the reception frequency of the duplexer device are different from each other so that the respective through holes 6' have to be made to show different lengths.

When the coaxial type resonators 3A' through 3C' and the coaxial type resonators 4A' through 4C' have different lengths and aligned with each other at an end surface thereof (open-circuit end surface 5'), they produce a step at the opposite end surface (short-circuit end surface). When such a resonator body 1b is placed into a holding hole 41 of a jig 40, it may not be held in a stable state because of the step at the bottom thereof.

If such is the case, the laminated circuit arrangement 10b is placed under the resonator body 1b in the holding hole 41. This technique will be described below in detail.

Figure 9:
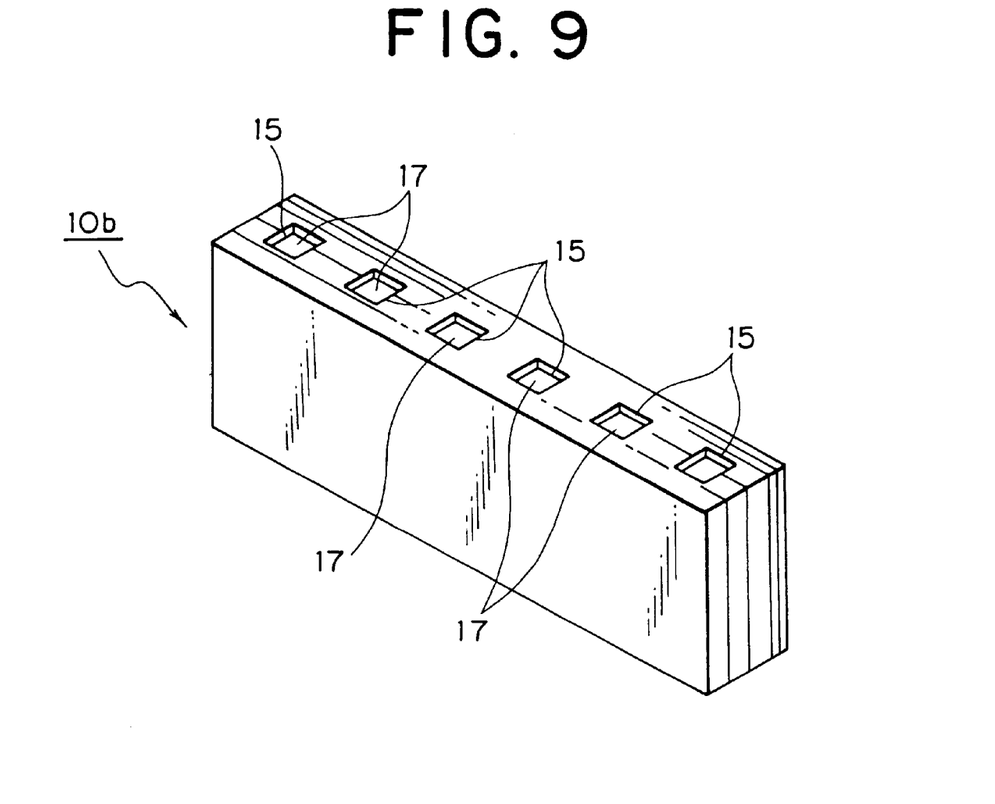
FIG. 9 is an enlarged schematic perspective view showing a laminated circuit arrangement in the embodiment of FIG. 8.
Figure 10:
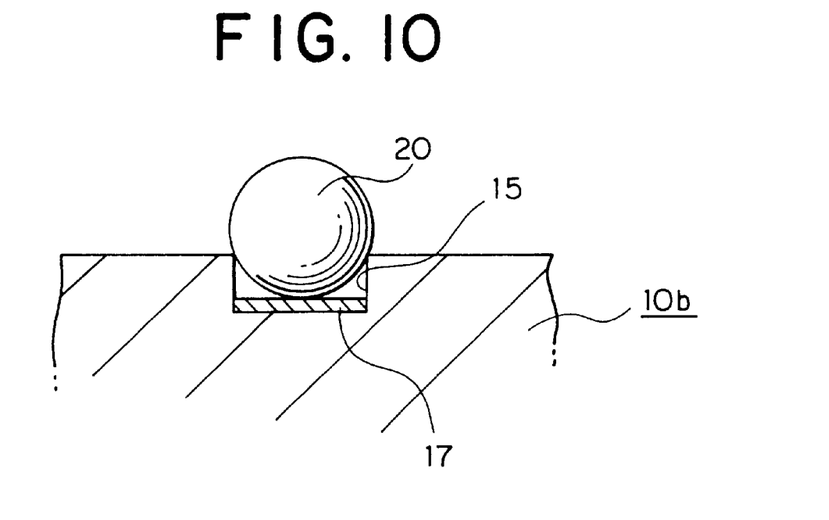
FIG. 10 is a schematic longitudinal partial section of the laminated circuit arrangement of FIG. 9, showing a principal area of a holding groove.
Figure 11:
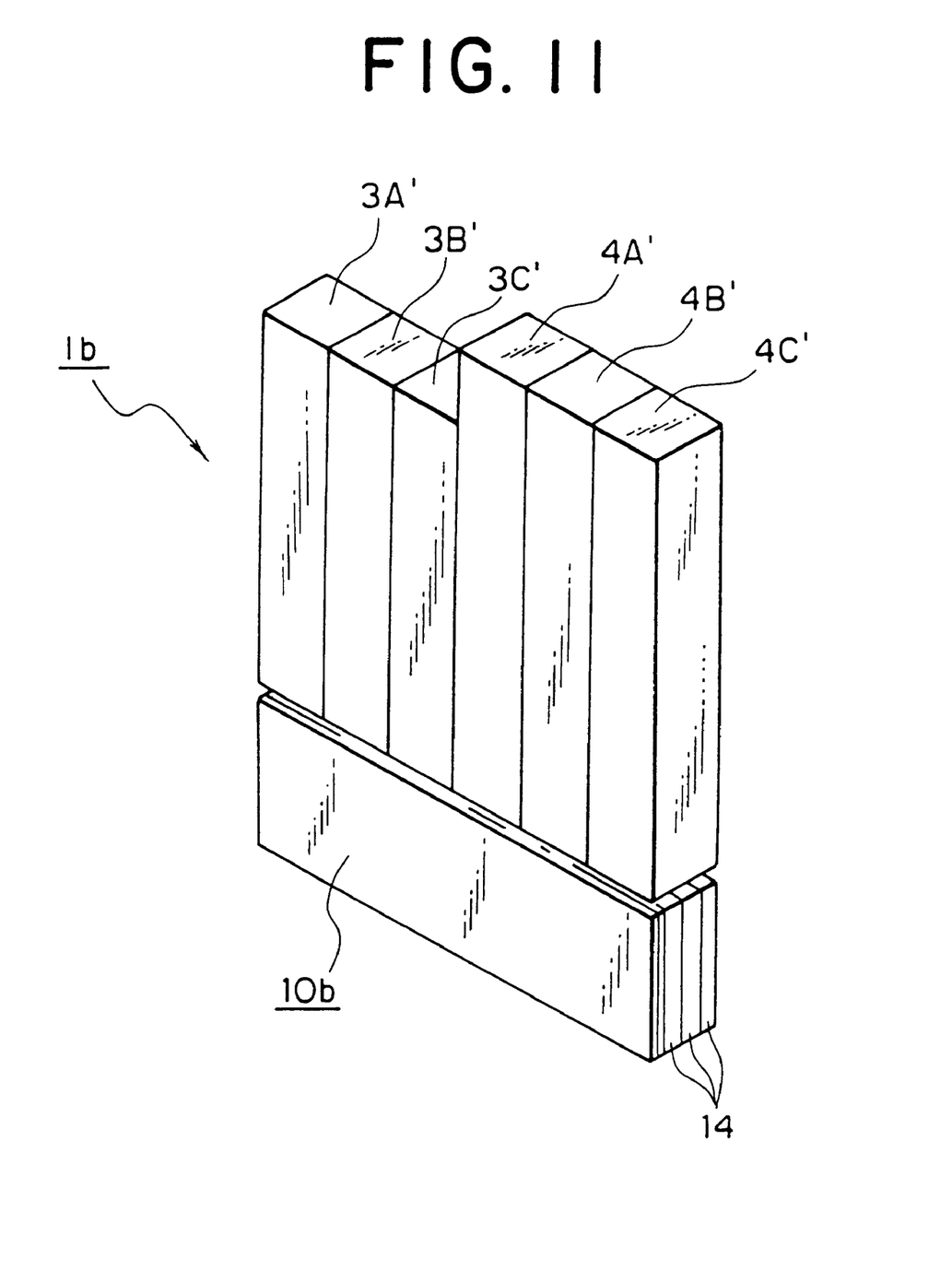
FIG. 11 is a schematic perspective view of the dielectric duplexer device according to the embodiment of FIG. 8, showing how it is assembled.
Figure 12:
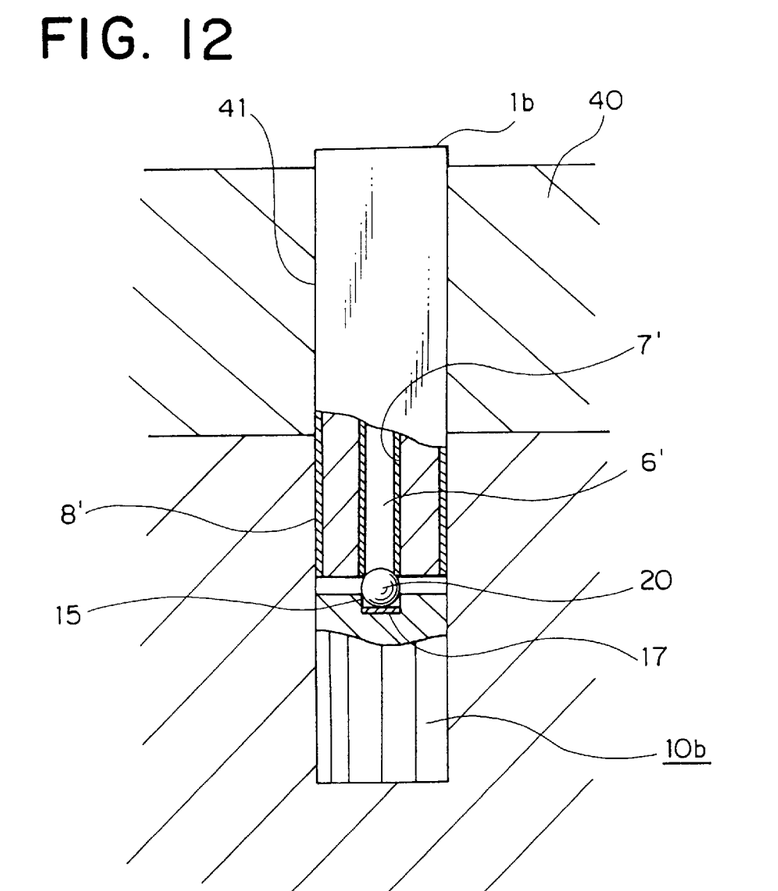
FIG. 12 is a schematic cross sectional side view showing the dielectric duplexer device of FIG. 8 placed in a jig during the assembly thereof.
Figure 13:
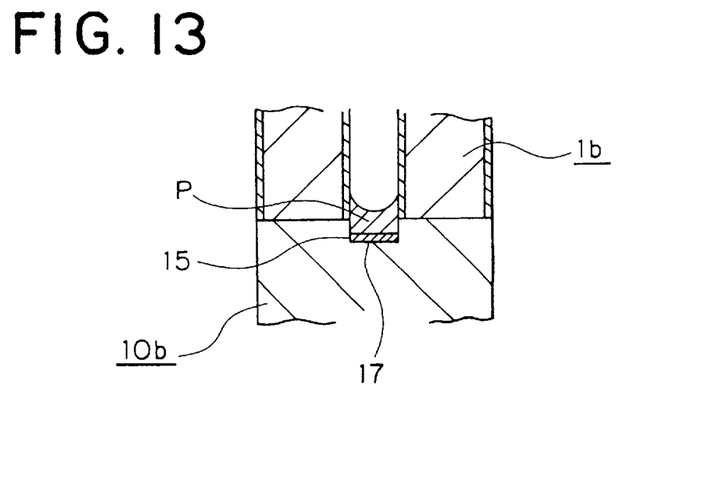
FIG. 13 is an enlarged schematic partial view of the dielectric duplexer device of FIG. 8, showing how the resonator body and the laminated circuit arrangement are bonded together.

By each holding groove 15 formed on each of the connection terminals 17 as shown in FIGS. 9 and 10, a solder ball 20 may be held in position with ease. Then, solder balls 20 arranged on an aligner plate are put into the respective holding grooves 15 of the laminated circuit arrangement 10b. Then, as shown in FIG. 11, the coaxial type resonators 3A' through 3C' and 4A' through 4C' are arranged on the laminated circuit arrangement 10b and put into the holding hole 41 of the jig 40, maintaining that state. Then, as in the case of the first embodiment, the inside of the holding hole 41 is heated to temperature higher than the melting point of the solder balls to melt the solder balls 20 as shown in FIG. 13.

It should be noted that the coaxial type resonators 3A' through 3C' and 4A' through 4C' may be aligned along the open-circuit end surface and bonded together by means of an electrically conductive adhesive agent.

With the above described bonding technique, the molten solder balls 20 are held in position by the respective holding grooves 15 and partly flow into the corresponding through holes of the resonators to produce uniformly defined solder sections that securely bond the connection terminals 17 and the corresponding edges of the inner conductor layers 7'. Then, the connection terminals 17 are electrically connected to the respective coaxial type resonators 3A' through 3C' and 4A' through 4C'.

Thus, if a step is produced at the other end side of the dielectric duplexer D2 that is opposite to the open-circuit end surface 5' by the difference in the length of the coaxial type resonators 3A' through 3C' and 4A' through 4C', the resonator body 1b and the laminated circuit arrangement 10b may be bonded together by means of a jig 40 by setting the laminated circuit arrangement 10b lower than the resonator body 1b.

It should be appreciated that the resonator body 1a prepared by using a single dielectric ceramic block as shown in FIG. 1 may also produce a step at the short-circuit end side when the length of the resonators 3A through 3C is to be differentiated from that of the resonators 4A through 4C. If such is the case, the resonator body 1a and the laminated circuit arrangement 10a can be bonded together by means of solder balls 20 by setting the laminated circuit arrangement 10a lower than the resonator body 1a as in the second embodiment. In this connection, it should be noted that the laminated circuit arrangement 10a may also be provided with grooves, which are similar to the holding grooves 15 on the laminated circuit arrangement 10b in the second embodiment, for holding solder balls 20 in position when the resonator body 1a is placed under the laminated circuit arrangement 10a in a holding hole 41.

As described above, the entire open end surface of the resonators of the resonator body 1a or 1b is covered by one of the layered side portions of the laminated circuit arrangement 10a or 10b, whichever appropriate, in any of the above described embodiments.

However, the resonator body and the laminated circuit arrangement may be bonded together only by way of the first or second filter section, also using the above described bonding technique.

Additionally, while one of the layered side portions of the laminated circuit arrangement 10a or 10b is used as the surface to be bonded to the corresponding resonator body in the above illustrated and described embodiments, a surface perpendicular relative to the layered side portions may alternatively be used to bond the laminated circuit arrangement and the resonator body.

Still additionally, while the present invention is described above by way of dielectric duplexer devices D1 and D2, a dielectric filter device according to the invention may be any integral type dielectric filter device that has two unit filters of different types with different pass frequency bands. Still additionally, it will be understood that a bonding technique according to the invention is generally applicable to any dielectric filter device comprising a resonator body formed by arranging a plurality of resonators in parallel in a same direction, each having a through hole whose inner surface is coated with an inner conductor, and a laminated circuit arrangement of a plurality of dielectric sheet members bonded to the open-circuit end surface of the resonator body.

As described above, according to the invention, a resonator body formed by arranging a plurality of resonators in parallel in a same direction and a laminated circuit arrangement of a plurality of dielectric sheet members are bonded together by means of solder balls to establish an electric connection between the resonators and the corresponding connection terminals at the open-circuit end surface of the resonator body, and the solder balls are turned into uniformly defined solder sections. Therefore, unlike conventional bonding techniques using an electrically conductive bonding agent, no short-circuiting occurs among any adjacently located resonators while a sufficient bonding strength is secured between the resonator body and the laminated circuit arrangement.

Additionally, the bonding operation is far from cumbersome because the solder balls are solid.

With a bonding technique for bonding the resonator body and the laminated circuit arrangement of a dielectric filter device as described above, solder balls are supported by the edges of the through holes of the resonator body with the laminated circuit arrangement placed thereon when the solder balls are molten and then solidified to bond the resonator body and the laminated circuit arrangement and establish an electric contact between them. Thus, the solder balls are placed in position by the respective edges of the through holes without requiring any aligning step.

Alternatively, the solder balls may be placed on the respective connection terminals of the laminated circuit arrangement with the resonator body placed thereon and the surface of its flat end directed downward when the solder balls are molten and then solidified to bond the resonator body and the laminated circuit arrangement. This alternative bonding technique may advantageously be applied to a dielectric duplexer device whose resonator body comprises first and filter second sections having different lengths to produce a step at an end surface.

Finally, the solder balls may be reliably held in position to facilitate the bonding operation when the laminated circuit arrangement is provided with solder ball holding grooves at positions corresponding to the respective connection terminals.

What is claimed is:

1. A method of manufacturing a dielectric filter device comprising the steps of:

preparing a resonator body by arranging a plurality of resonators in parallel in a same direction, each having a through hole whose inner surface is coated within an inner conductor layer;

preparing a laminated circuit arrangement by stacking a plurality of dielectric sheet members each having a desired circuit pattern and sintering them, the laminated circuit arrangement being provided with a plurality of connection terminals on one of outer surfaces which is to be bonded to an open-circuit end surface of the resonator body;

bonding the resonator body and the laminated circuit arrangement together and electrically connecting the resonators and the corresponding connection terminals by arranging a solder ball between an open-circuit end of each of the resonators of the resonator body and the corresponding connection terminals of the laminated circuit arrangement and melting and solidifying the respective solder balls; and wherein the melting and solidifying of the respective solder balls are performed under the condition that the solder balls are supported by the edges of the through holes of the resonator body that lay on the open-circuit end surface of the resonator body and the resonator body is placed in a holding hole of a jig with the laminated circuit arrangement arranged on the resonator body.

2. A method of manufacturing a dielectric filter device as claimed in claim 1, wherein grooves for holding respective solder balls are formed in the laminated circuit arrangement at positions corresponding to the terminal connections before arranging the respective solder balls.

3. A method of manufacturing a dielectric filter device comprising the steps of:

preparing a resonator body by arranging a plurality of resonators in parallel in a same direction, each having a through hole whose inner surface is coated within an inner conductor layer;

preparing a laminated circuit arrangement by stacking a plurality of dielectric sheet members each having a desired circuit pattern and sintering them, the laminated circuit arrangement being provided with a plurality of connection terminals on one of outer surfaces which is to be bonded to an open-circuit end surface of the resonator body;

bonding the resonator body and the laminated circuit arrangement together and electrically connecting the resonators and the corresponding connection terminals by arranging a solder ball between an open-circuit end of each of the resonators of the resonator body and the corresponding connection terminals of the laminated circuit arrangement and melting and solidifying the respective solder balls; and wherein the melting and solidifying of the respective solder balls are performed under the condition that the solder balls are positioned on the connection terminals of the laminated circuit arrangement and the resonator body is placed in a holding hole of a jig with its flat open-circuit end surface directed downward.

4. A method of manufacturing a dielectric filter device as claimed in claim 3, wherein grooves for holding respective solder balls are formed in the laminated circuit arrangement at positions corresponding to the terminal connections before arranging the respective solder balls.

* * * * *